(12) United States Patent
Namie et al.

(10) Patent No.: US 11,982,441 B1
(45) Date of Patent: May 14, 2024

(54) LIGHT-EMITTING MODULE

(71) Applicant: NICHIA CORPORATION, Anan (JP)

(72) Inventors: Takashi Namie, Anan (JP); Tatsuya Kanazawa, Anan (JP); Masanobu Tanaka, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/547,861

(22) PCT Filed: Oct. 20, 2021

(86) PCT No.: PCT/JP2021/038763
§ 371 (c)(1),
(2) Date: Aug. 24, 2023

(87) PCT Pub. No.: WO2022/180927
PCT Pub. Date: Sep. 1, 2022

(30) Foreign Application Priority Data

Feb. 25, 2021 (JP) .................................. 2021-028983

(51) Int. Cl.
*F21V 7/09* (2006.01)
*F21V 5/04* (2006.01)
(Continued)

(52) U.S. Cl.
CPC .................. *F21V 7/09* (2013.01); *F21V 5/04* (2013.01); *G03B 21/2033* (2013.01);
(Continued)

(58) Field of Classification Search
CPC ... F21V 7/09; G03B 21/2013; G03B 21/2033; G03B 21/208; G03B 21/2066
See application file for complete search history.

(56) References Cited

U.S. PATENT DOCUMENTS

2010/0328633 A1 12/2010 Sato et al.
2013/0162956 A1* 6/2013 Okuda ............... G03B 21/2013
353/30
(Continued)

FOREIGN PATENT DOCUMENTS

JP 2011-013317 A 1/2011
JP 2013-179247 A 9/2013
(Continued)

OTHER PUBLICATIONS

Machine translation of WO 2016/204101 A1 to "Kabuki, Kiyoyuki", published Dec. 22, 2016 (Year: 2016).*
(Continued)

*Primary Examiner* — William N Harris
(74) *Attorney, Agent, or Firm* — Global IP Counselors, LLP

(57) ABSTRACT

A light-emitting module includes: first and second light-emitting devices each including semiconductor laser elements that emit laser beams with an interval in a slow axis direction of the laser beams; a first optical unit that includes one or more first reflective members provided with reflective surfaces on which laser beams are incident and that makes the interval of the laser beams smaller and emits the laser beams; a second optical unit that includes second reflective members provided with reflective surfaces on which laser beams are incident and that reflects, two times or more, laser beams emitted with an interval in a fast axis direction and emits the laser beams with a smaller interval and with a smaller width in the fast axis direction of the laser beams; and a condenser lens that gathers laser beams having traveled through the first optical unit and the second optical unit.

8 Claims, 8 Drawing Sheets

(51) Int. Cl.
*F21Y 113/00* (2016.01)
*F21Y 115/30* (2016.01)
*G03B 21/20* (2006.01)

(52) U.S. Cl.
CPC ....... *G03B 21/2066* (2013.01); *G03B 21/208* (2013.01); *F21Y 2113/00* (2013.01); *F21Y 2115/30* (2016.08)

(56) References Cited

U.S. PATENT DOCUMENTS

| | | | |
|---|---|---|---|
| 2013/0230064 A1 | 9/2013 | Tanaka et al. | |
| 2016/0327851 A1* | 11/2016 | Liao | G03B 21/2066 |
| 2017/0138545 A1 | 5/2017 | Minor et al. | |
| 2017/0329209 A1* | 11/2017 | Tajiri | G03B 21/2066 |
| 2018/0292053 A1 | 10/2018 | Minor et al. | |
| 2020/0088358 A1 | 3/2020 | Minor et al. | |
| 2020/0301156 A1* | 9/2020 | Nagahara | G02B 27/283 |
| 2020/0400277 A1 | 12/2020 | Mori et al. | |
| 2021/0254797 A1 | 8/2021 | Minor et al. | |

FOREIGN PATENT DOCUMENTS

| | | | |
|---|---|---|---|
| JP | 2015-072956 A | 4/2015 | |
| JP | 2017-054764 A | 3/2017 | |
| JP | 2017-527111 A | 9/2017 | |
| JP | 2020-204734 A | 12/2020 | |
| WO | WO-2016204101 A1 * | 12/2016 | |
| WO | WO-2019144495 A1 * | 8/2019 | G02B 19/0019 |

OTHER PUBLICATIONS

Machine translation of WO 2019/144495 A1, to "Hou et al.", published Aug. 1, 2019 (Year: 2019).*
International Search Report in PCT/JP2021/038763, dated Nov. 22, 2021.

* cited by examiner

LIGHT-EMITTING MODULE

CROSS-REFERENCE TO RELATED APPLICATIONS

This is a U.S. National stage application of International Patent Application No. PCT/JP2021/038763, filed on Oct. 20, 2021, which claims priority to Japanese Patent Application No. 2021-028983, filed in Japan on Feb. 25, 2021. The entire contents of Japanese Patent Application No. 2021-028983 are hereby incorporated herein by reference.

TECHNICAL FIELD

The present invention relates to a light-emitting module.

BACKGROUND ART

There is an optical control technique for obtaining desired light by irradiating a plurality of optical function surfaces that have an optical function, such as reflection, refraction, or the like, with light emitted from a light-emitting element. JP 2013-179247 A discloses a technique for controlling the beam width of a laser beam to a desired size by using optical members, such as a prism, lens, and the like.

SUMMARY

A technique is disclosed that allows narrowing of the overall illumination region of a plurality of beams of light emitted from a plurality of emission positions when using the plurality of beams of light.

A light-emitting module according to an embodiment includes: a first light-emitting device that includes a plurality of first semiconductor laser elements each of which emits a first laser beam, the plurality of first laser beams being emitted with an interval of a first distance in a slow axis direction of the first laser beams; a second light-emitting device that is arranged side by side with the first light-emitting device in a fast axis direction and includes a plurality of second semiconductor laser elements each of which emits a second laser beam, the plurality of second lasers being emitted with an interval of a second distance in a slow axis direction of the second laser beams and with a third distance away from the first laser beams in a fast axis direction, a first optical unit that includes one or more first reflective members provided with a plurality of reflective surfaces on which the plurality of first laser beams and the plurality of second laser beams are incident and that makes the interval of the plurality of first laser beams arranged in the slow axis direction smaller than the first distance, makes the interval of the plurality of second laser beams arranged in the slow axis direction smaller than the second distance, and emits the plurality of first laser beams and the plurality of second laser beams; a second optical unit that includes a plurality of second reflective members provided with a plurality of reflective surfaces on which the plurality of first laser beams and the plurality of second laser beams are incident, that reflects, two times or more, the first laser beams and the second laser beams, and that emits the laser beams with an interval smaller than the third distance and with a smaller width in the fast axis direction of each of the laser beams; and a condenser lens that gathers the plurality of first laser beams and the plurality of second laser beams having traveled through the first optical unit and the second optical unit.

According to the present invention, a light-emitting module can be obtained that can narrow the overall illumination region of a plurality of beams of light and, for example, generates emission light using the narrowed plurality of beams of light.

DESCRIPTION OF EMBODIMENTS

Figure 1:
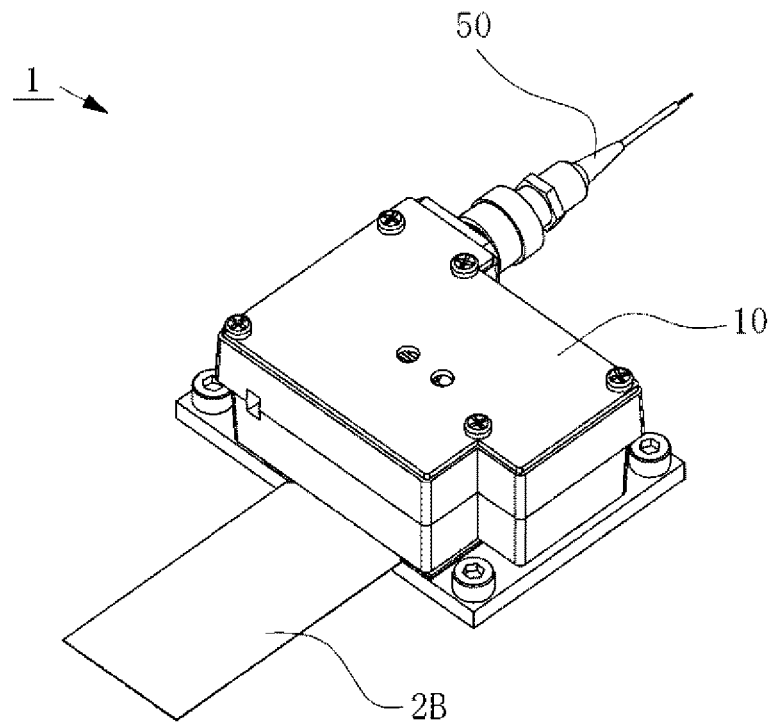
FIG. 1 is a perspective view of a light-emitting module according to an embodiment.

In this specification or the claims, polygons such as triangles and quadrangles, including shapes in which the corners of the polygon are rounded, beveled, chamfered, or coved, are referred to as polygons. A shape obtained by processing not only the corners (ends of sides) but also an intermediate portion of a side is similarly referred to as a polygon. That is, a shape that is partially processed while remaining a polygon shape as a base is included in the interpretation of "polygon" described in this specification and the claims.

The same applies not only to the polygon but also to a word representing a specific shape such as a trapezoid, a circle, a protrusion, and a recession. The same applies when dealing with each side forming that shape. That is, even if processing is performed on a corner or an intermediate portion of a certain side, the interpretation of "side" includes the processed portion. Note that when a "polygon" or "side" not partially processed is to be distinguished from a processed shape, "exact" will be added to the description as in, for example, "exact quadrangle".

In this specification and the claims, descriptions such as upper and lower, left and right, front and back, before and after, near and far, and the like are used merely to describe the relative relationship of positions, orientations, directions, and the like, and the expressions need not necessarily match an actual relationship at the time of use.

In the drawings, directions such as an X direction, a Y direction, and a Z direction may be indicated by using arrows. The directions of the arrows are the same across multiple drawings of the same embodiment.

The term "member" or "portion" may be used to describe a component or the like in this specification. The term "member" refers to an object treated as a single physical object. The object treated as a single physical object can be referred to as an object treated as a single component in a manufacturing step. On the other hand, the term "portion" refers to an object that need not be treated as a single physical object. For example, the term "portion" is used to refer to one part of a single member.

Note that the distinction between "member" and "portion" described above does not indicate an intention to consciously limit the scope of rights in interpretation of the doctrine of equivalents. In other words, even when there is a component described as "member" in the claims, this does not mean that the applicant recognizes that a component being treated as a single physical object is essential in the application of the present invention.

In this specification and the claims, when there are a plurality of components and these components are to be indicated separately, the components may be distinguished by adding the terms "first" and "second" at the beginning of the name of the component. Further, objects to be distinguished may differ between this specification and the claims. Thus, even when a component in the claims is given the same term as that in this specification, the object indicated by that component is not the same across this specification and the claims in some cases.

For example, when there are components distinguished by being termed "first", "second", and "third" in this specification, and when components given the terms "first" and "third" in this specification are described in the claims, these components may be distinguished by being denoted as "first" and "second" in the claims for ease of understanding. In this case, the components denoted as "first" and "second" in the claims refer to the components termed "first" and "third" in this specification, respectively. Note that this rule applies to not only components but also other objects in a reasonable and flexible manner.

Embodiments for implementing the present invention will be described below. Specific embodiments for implementing the present invention will be described below with reference to the drawings. Embodiments for implementing the present invention are not limited to the specific embodiments. In other words, the illustrated embodiments are not an only form in which the present invention is realized. Sizes, positional relationships, and the like of members illustrated in the drawings may sometimes be exaggerated in order to facilitate understanding.

Embodiment

Figure 2:
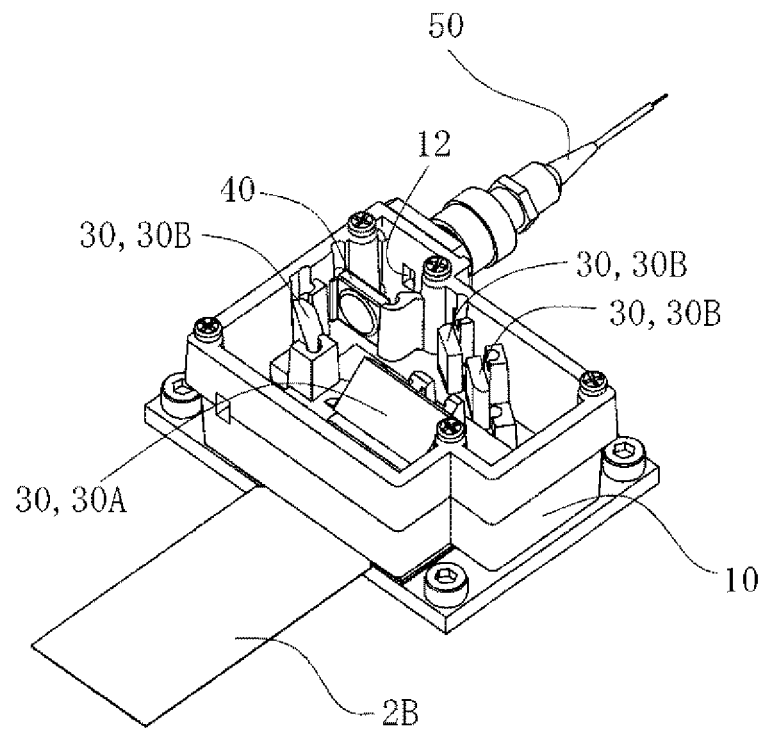
FIG. 2 is a perspective view for describing components disposed inside a housing of the light-emitting module according to the embodiment.
Figure 3:
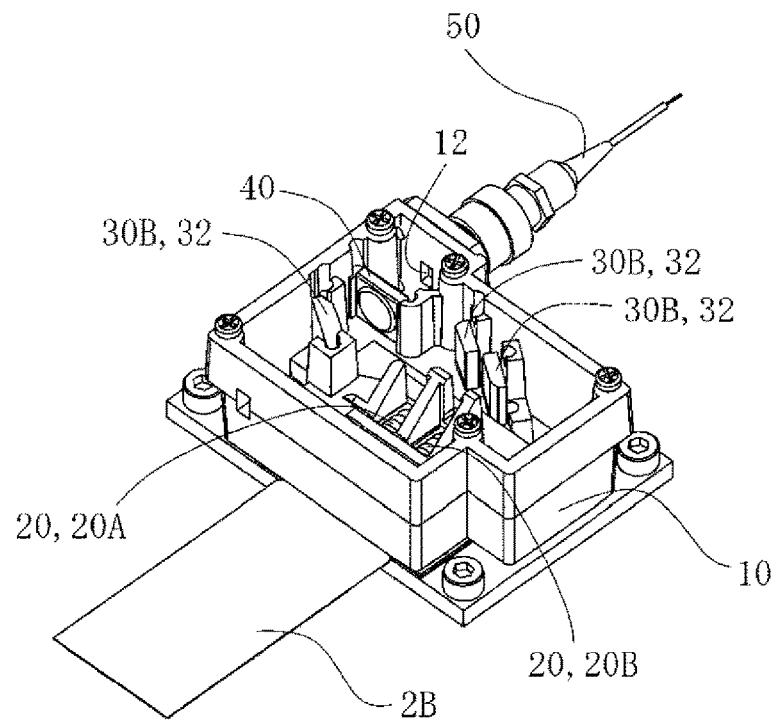
FIG. 3 is a perspective view of the state of FIG. 2 with a first optical unit removed.
Figure 4:
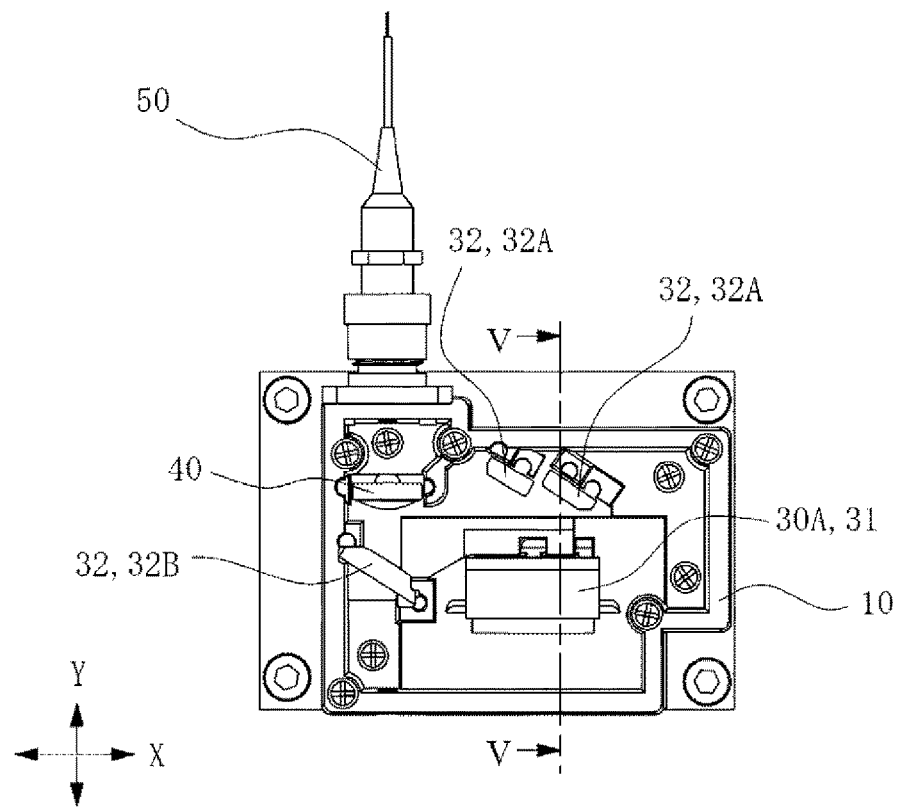
FIG. 4 is a top view of the state of FIG. 2 with a flexible wiring line removed.
Figure 5:
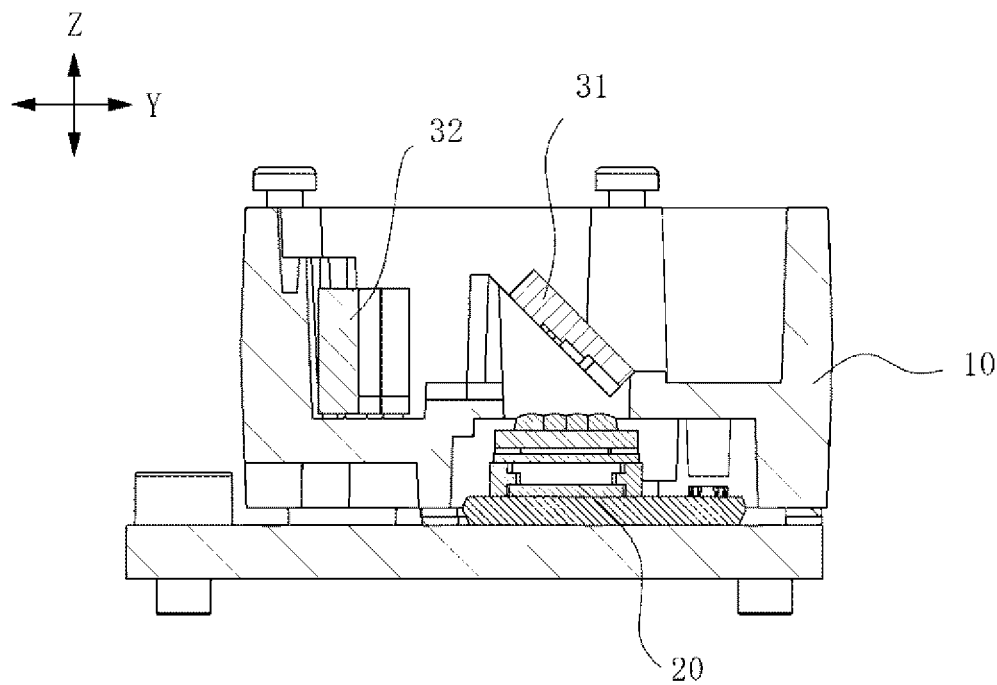
FIG. 5 is a cross-sectional view taken along line V-V in FIG. 4.
Figure 6:
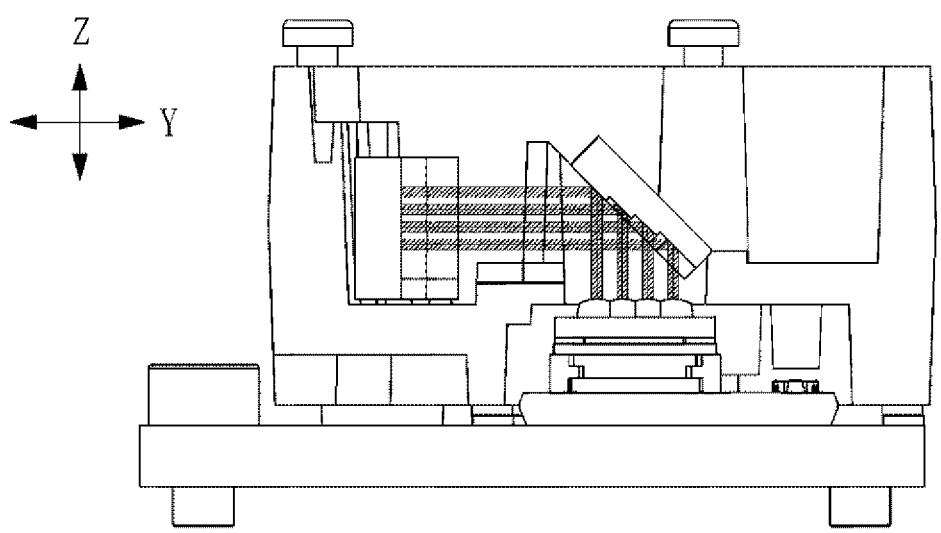
FIG. 6 is a schematic diagram illustrating the optical function of the first optical unit.
Figure 7:
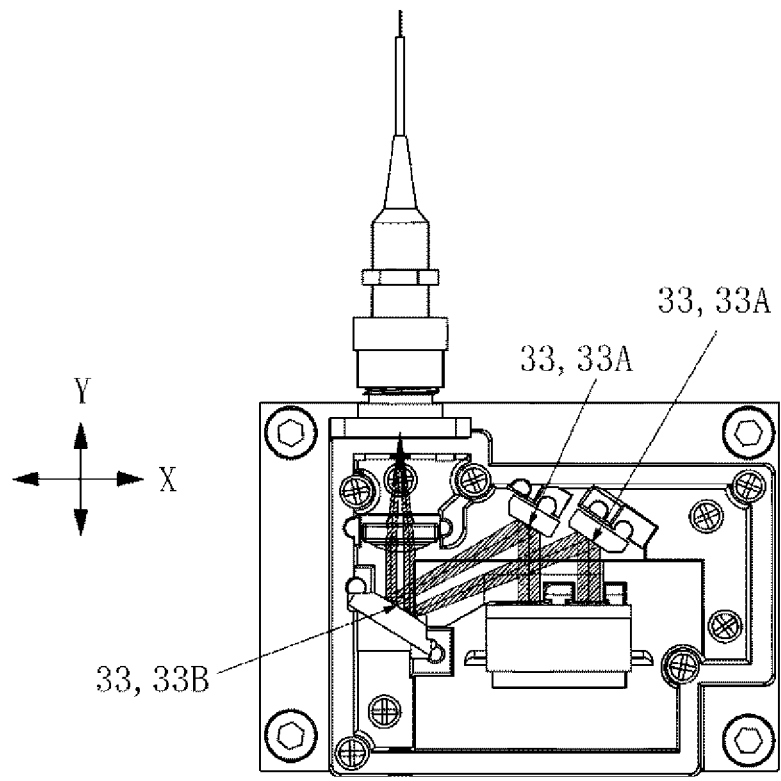
FIG. 7 is a schematic diagram illustrating the optical function of a second optical unit.
Figure 8:
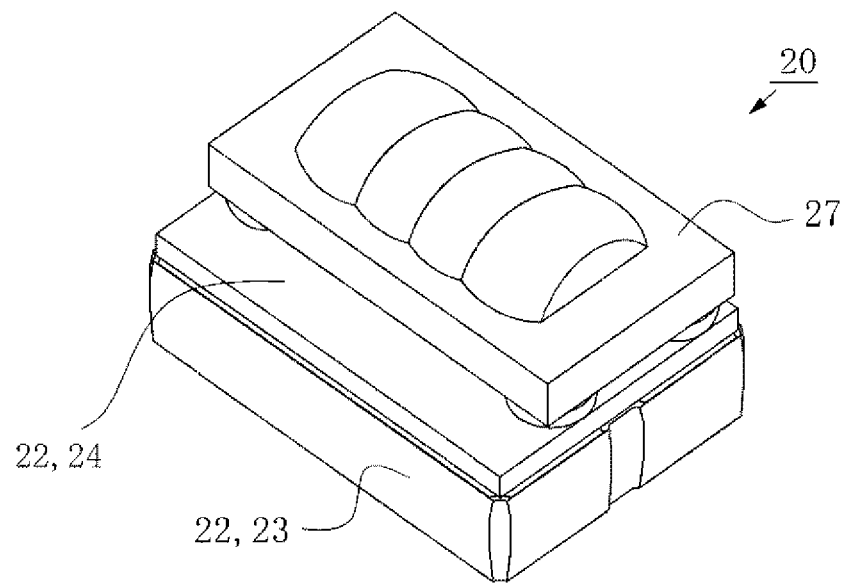
FIG. 8 is a perspective view of a light-emitting device according to the embodiment.
Figure 9:
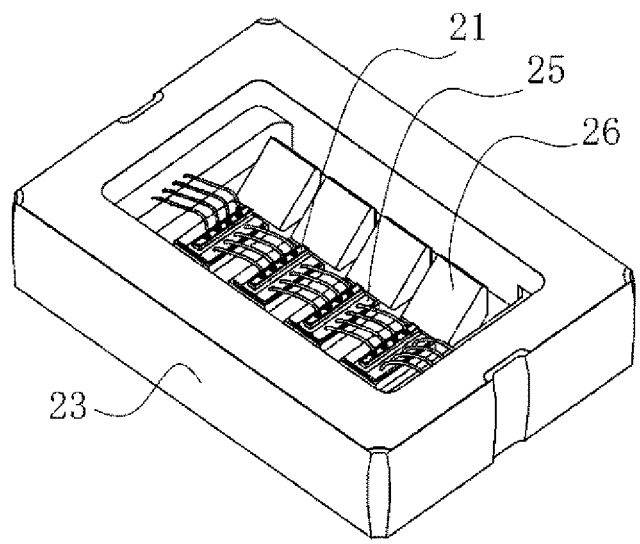
FIG. 9 is a perspective view for describing the components disposed inside the light-emitting device according to the embodiment.
Figure 10:
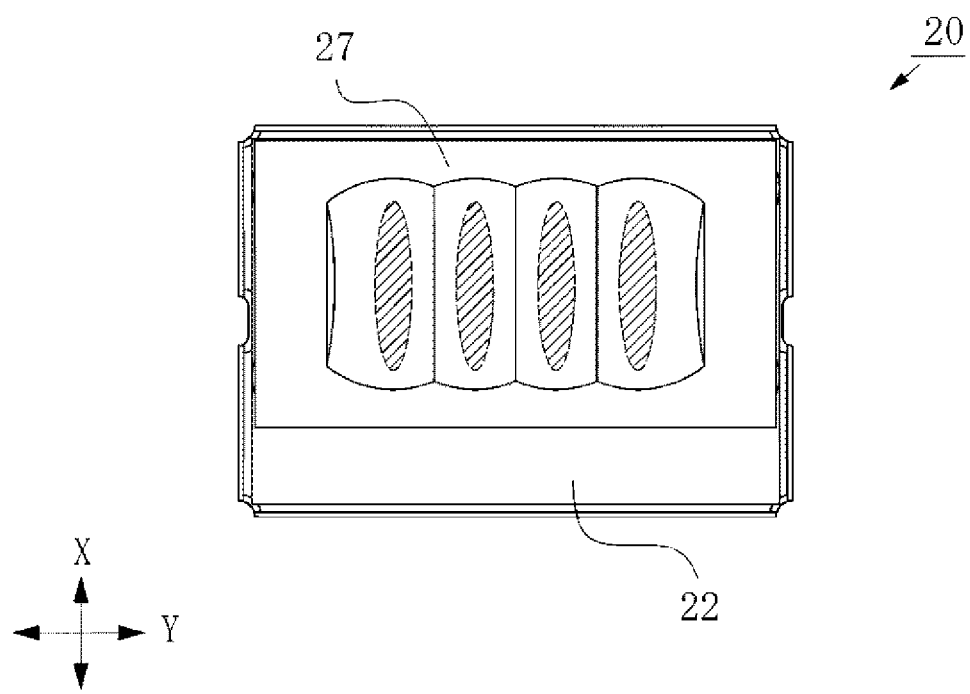
FIG. 10 is a top view of the light-emitting device according to the embodiment.
Figure 11:
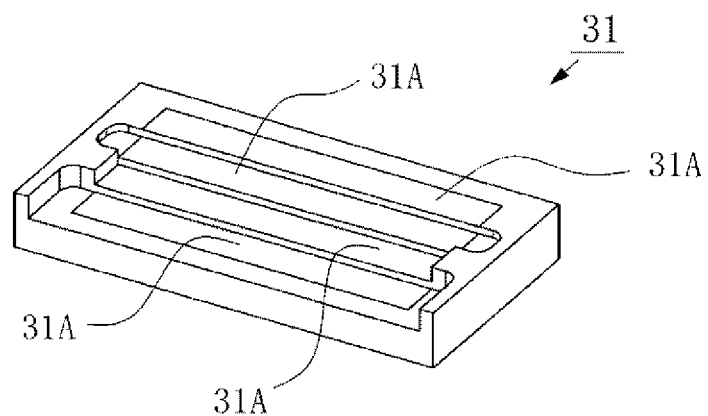
FIG. 11 is a perspective view of a first reflective member according to the embodiment.
Figure 12:
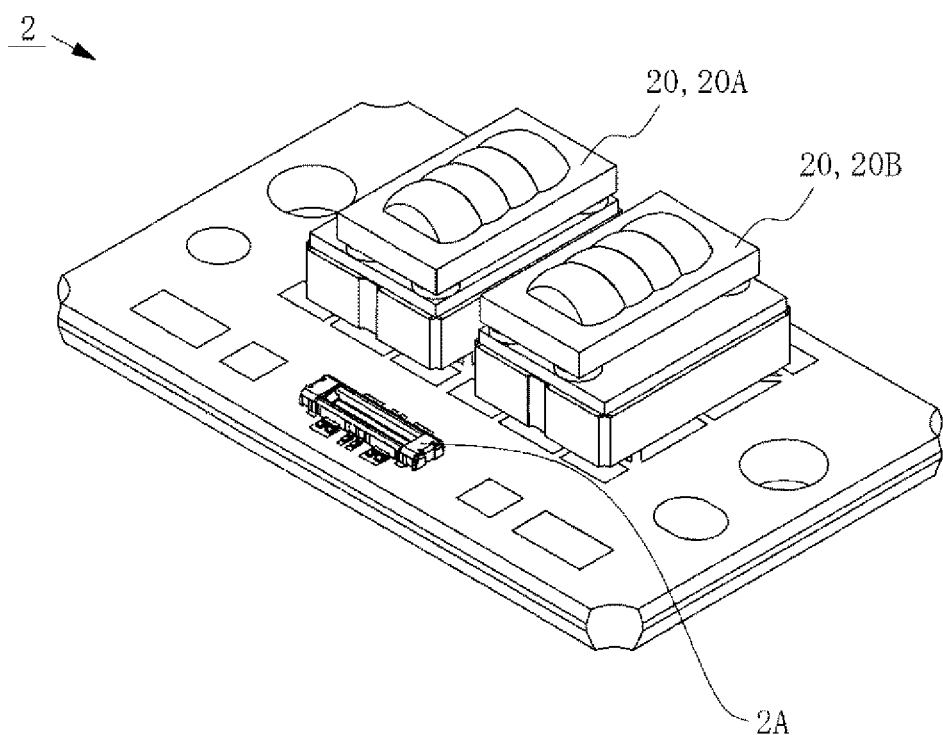
FIG. 12 is a perspective view of a light-emitting unit according to the embodiment.
Figure 13:
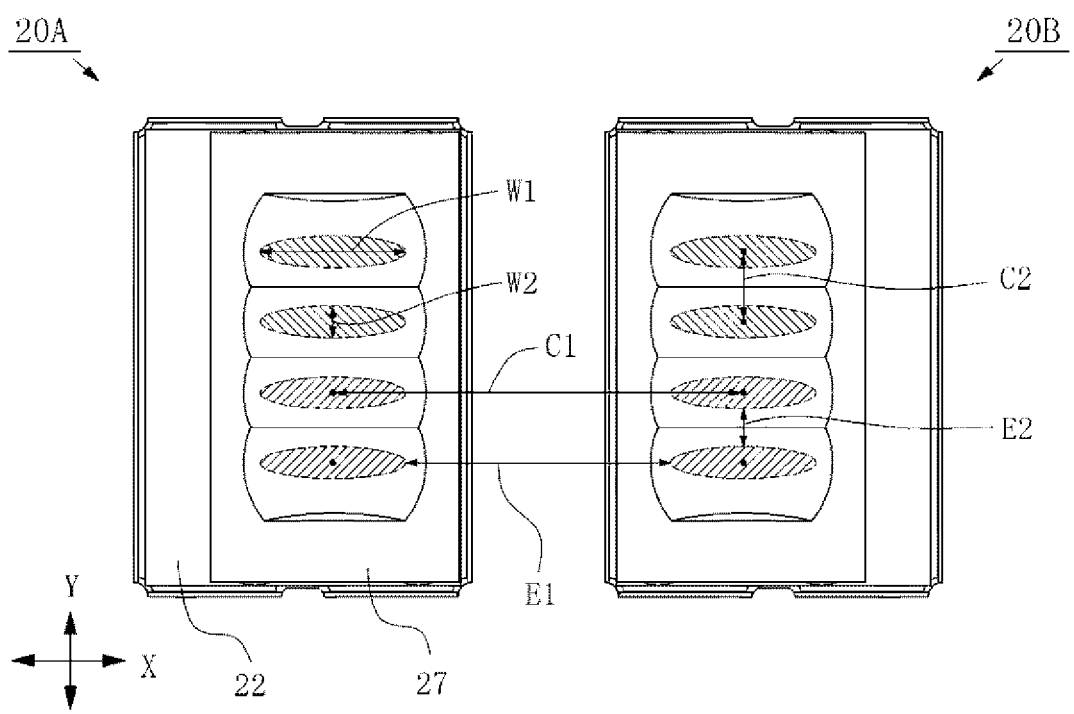
FIG. 13 is a schematic diagram for describing a first light emission width, a second light emission width, a first center-to-center distance, a second center-to-center distance, a first outer edge-to-outer edge distance, and a second outer edge-to-outer edge distance according to the embodiment.

A light-emitting module 1 according to the embodiment will be described. FIGS. 1 to 13 are diagrams for describing an exemplary form of the light-emitting module 1. FIG. 1 is a perspective view of the light-emitting module 1. FIG. 2 is a perspective view for describing a plurality of components disposed in the internal space of a housing 10 of the light-emitting module 1. FIG. 3 is a perspective view of the state in FIG. 2 with a first optical unit 30A removed. FIG. 4 is a top view of the state in FIG. 2 with a flexible wiring line 2B removed. FIG. 5 is a cross-sectional view taken along line V-V in FIG. 4. FIG. 6 is a schematic diagram for describing the optical function of the first optical unit 30A. FIG. 6 is based on the cross-sectional view of FIG. 5, but the optical paths are indicated with hatching and the hatching indicating the cross-section in FIG. 5 is omitted for clarity. FIG. 7 is a schematic diagram for describing the optical function of a second optical unit 30B. The optical paths are indicated by hatching. FIG. 8 is a perspective view of a light-emitting device 20. FIG. 9 is a perspective view for describing the components disposed inside the light-emitting device. FIG. 10 is a top view of the light-emitting device 20. Note that the illumination regions of the light emitted from the light-emitting device 20 are indicated by hatching. FIG. 11 is a perspective view of a first reflective member 31. FIG. 12 is a perspective view of a light-emitting unit 2. FIG. 13 is a schematic diagram illustrating parameters of a first light emission width, a second light emission width, a first center-to-center distance, a second center-to-center distance, a first outer edge-to-outer edge distance, and a second outer edge-to-outer edge distance described in the following embodiment. Hatching indicates the same illumination region as that in FIG. 10, and the center point of this illumination region is also indicated as necessary.

The light-emitting module 1 includes a plurality of components. The plurality of components include the housing 10, one or more light-emitting devices 20, one or more optical units 30, a condenser lens 40, and an optical fiber 50.

The light-emitting module 1 may include a plurality of light-emitting devices 20 including a first light-emitting device 20A and a second light-emitting device 20B. The light-emitting module 1 may include a plurality of optical units 30 including the first optical unit 30A and the second optical unit 30B.

The light-emitting module 1 may also include a component other than these components. For example, the light-emitting module 1 may further include a light-emitting device different from the plurality of light-emitting devices 20. The light-emitting module 1 need not include some of the components described above.

First, each of the components will be described.

Housing 10

A space (hereinafter referred to as an arrangement space) for disposing the other components is provided inside the housing 10. In other words, the housing 10 can be said to be a component that defines the arrangement space. The housing 10 preferably has a structure that does not allow gas outside of the housing to easily enter the arrangement space. For example, the housing 10 may be formed such that the arrangement space is a sealed space.

The housing 10 includes a mounting surface for mounting the other components, one or more lateral surfaces surrounding the mounting surface, and a first surface that is located above the mounting surface, opposing the mounting surface. The housing 10 includes a light emission portion 12 for allowing light to pass through from the arrangement space to the outside of the housing 10.

The housing 10 defines the arrangement space, with a maximum length in a first direction being greater than a maximum length in a second direction perpendicular to the first direction in a top view. In the illustrated light-emitting module 1, the first direction corresponds to the X direction and the second direction corresponds to the Y direction.

The housing 10 can be formed using an aluminum alloy as the main material. For example, the housing 10 can be formed using a zinc alloy, a magnesium alloy, a copper alloy, or the like as the main material. The term "main material" refers to a material with the largest proportion in the target formed product in terms of weight or volume. When a target formed product is formed of one material, that material is the main material. In other words, when a certain material is the main material, the proportion of that material may be 100%.

Light-Emitting Device 20

The light-emitting device 20 includes one or more components including at least a light-emitting element 21. The light-emitting device 20 may include a plurality of components including the one or more light-emitting elements 21, a package 22, one or more submounts 25, one or more reflective members 26, and one or more lens members 27.

The light-emitting device 20 may include a component other than these components. For example, the light-emitting device 20 may further include a light-emitting element different from the plurality of light-emitting elements 21. The light-emitting device 20 need not include some of the components described above.

In a top view, the package 22 has a rectangular external shape with long sides and short sides. In the illustrated light-emitting module 1, the long side direction of the package 22 corresponds to the Y direction and the short side direction of the package 22 corresponds to the X direction.

A space for disposing the other components of the light-emitting device 20 is provided inside the package 22. This space may be a sealed space. The package 22 may be composed of, for example, a base member 23 with light-blocking properties forming a recess portion and a lid member 24 with transmissivity covering the recess portion.

The one or more light-emitting elements 21 are disposed in the space inside the package 22. The one or more reflective members 26 are disposed in the space. The one or more submounts 25 are disposed in the space. The one or more light-emitting elements 21 are placed on the one or more submounts 25.

A semiconductor laser element can be employed for the light-emitting element 21. The light-emitting element 21 is not limited to a semiconductor laser element, and a light-emitting diode or the like may be employed. When a semiconductor laser element is employed as the light-emitting element 21, the space inside the package 22 is preferably sealed in an airtight state. This inhibits quality degradation of light due to dust accumulation.

The light-emitting element 21 is disposed on the mounting surface (hereinafter, the mounting surface of the housing is referred to as a first mounting surface and the mounting surface of the package 22 is referred to as a second mounting surface to distinguish between them) of the package 22 and emits light laterally. The light-emitting surface of the light-emitting element 21 is provided on the lateral surface of the light-emitting element 21. The light-emitting surface is not limited to the lateral surface of the light-emitting element 21 and may be provided on the upper surface, for example.

The light emitted from the light-emitting surface of the light-emitting element 21 is emitted to the reflective surface of the reflective member 26. The light reflected by the reflective member 26 travels upward and is emitted to the outside of the package 22. The light emitted to the outside of the package 22 passes through the lens member 27 and is emitted to the outside of the light-emitting device 20.

As the light-emitting element 21, for example, a light-emitting element that emits blue light, a light-emitting element that emits green light, or a light-emitting element that emits red light may be employed. A light-emitting element that emits light of another color may be employed as the light-emitting element 21.

Blue light refers to light having a light emission peak wavelength within a range from 420 nm to 494 nm. Green light refers to light having a light emission peak wavelength within a range from 495 nm to 570 nm. Red light refers to light having a light emission peak wavelength within a range from 605 nm to 750 nm.

The one or more lens members 27 are disposed above the package 22. The one or more lens members 27 are fixed to the package 22. One or more lens surfaces are provided by the one or more lens members 27.

The light passing through the one or more lens members 27 is emitted as collimated light. The lens surface is designed so as to collimate light incident on the lens member 27. Collimated light is emitted from each lens surface provided by the one or more lens members 27.

The light-emitting device 20 emits a plurality of beams of light. The plurality of light beams are emitted from the light-emitting device 20 with an interval of a predetermined distance in a predetermined direction. The plurality of collimated beams of light are emitted from the light-emitting device 20. The light-emitting device 20 collimates and emits the plurality of beams of light.

The light-emitting device 20 emits a plurality of beams of light based on the light emitted from the one or more light-emitting elements 21. The beams of light may be light beams emitted from different light-emitting elements 21. The light-emitting device 20 may include three or more light-emitting elements 21.

On a plane perpendicular to a travel direction of the light, the illumination region with the first light emission width and the second light emission width perpendicular to the first light emission width is defined by the light emitted from the light-emitting device 20. The first light emission width is larger than the second light emission width. The maximum width of the light-emitting region in the plane may correspond to the first light emission width.

In the illustrated light-emitting device 20, the plurality of light-emitting elements 21 are arranged side by side. The light-emitting device 20 includes four light-emitting elements 21. An interval of a predetermined distance is provided between the light-emitting elements 21 arranged side by side. The plurality of light-emitting elements 21 are arranged at equal intervals. The arrangement direction of the plurality of light-emitting elements 21 corresponds to the Y direction. The light-emitting elements 21 are all semiconductor laser elements.

In the illustrated light-emitting device 20, a plurality of beams of light are emitted with an interval of a predetermined distance in the Y direction. The plurality of beams of light arranged at equal intervals are emitted from the light-emitting device 20. The arrangement direction of the plurality of beams of light corresponds to the Y direction. The first light emission width corresponds to the X direction, and the second light emission width corresponds to the Y direction.

A semiconductor laser element, an example of the light-emitting element 21, will be described. Light (laser beam) emitted from the semiconductor laser element spreads. Divergent light is emitted from an emission end surface of the semiconductor laser element. The emission end surface of the semiconductor laser element can be referred to as the light-emitting surface of the light-emitting element 21.

The light emitted from the semiconductor laser element forms a far field pattern (hereinafter referred to as an "FFP") of an elliptical shape in a plane parallel to the emission end surface of the light. The FFP indicates a shape and a light intensity distribution of the emitted light at a position separated from the emission end surface.

Light passing through the center of the elliptical shape of the FFP, in other words, light having a peak intensity in the light intensity distribution of the FFP is referred to as light traveling on an optical axis or light passing through an optical axis. Based on the light intensity distribution of the FFP, light having an intensity of $1/e^2$ or more with respect to a peak intensity value is referred to as a main portion of the light.

The shape of the FFP of the light emitted from the semiconductor laser element is an elliptical shape in which the light is longer in a layering direction than in a direction perpendicular to the layering direction in the plane parallel to the emission end surface of the light. The layering direction is a direction in which a plurality of semiconductor layers including an active layer are layered in the semiconductor laser element. The direction perpendicular to the layering direction can also be referred to as a plane direction of the semiconductor layer. A long diameter direction of the elliptical shape of the FFP can also be referred to as a fast axis direction of the semiconductor laser element, and a short diameter direction can also be referred to as a slow axis direction of the semiconductor laser element.

Based on the light intensity distribution of the FFP, an angle at which light having a light intensity of $1/e^2$ of a peak light intensity spreads is referred to as a divergence angle of light of the semiconductor laser element. For example, a divergence angle of light may also be determined based on the light intensity that is half of the peak light intensity other than being determined based on the light intensity of $1/e^2$ of the peak light intensity. In the description in the present specification, the term "divergence angle of light" by itself refers to a divergence angle of light at the light intensity of $1/e^2$ of the peak light intensity. It can be said that a divergence angle in the fast axis direction is greater than a divergence angle in the slow axis direction.

Examples of a semiconductor laser element that emits blue light or a semiconductor laser element that emits green light include a semiconductor laser element including a nitride semiconductor. GaN, InGaN, and AlGaN, for example, can be used as the nitride semiconductor. Examples of a semiconductor laser element that emits red light include a semiconductor laser element including an InAlGaP-based, GaInP-based, GaAs-based, or AlGaAs-based semiconductor.

In the illustrated light-emitting device 20, the fast axis direction of the laser beam emitted from the light-emitting device 20 corresponds to the X direction, and the slow axis direction corresponds to the Y direction. The plurality of beams of light emitted from the plurality of light-emitting elements 21 are emitted from the light-emitting device 20 without at least the main portions of the beams of light overlapping one another. When the main portions of the beams of light do not overlap in this manner, an arrangement in the slow axis direction can result in a smaller package 22 than an arrangement in the fast axis direction.

In the illustrated light-emitting device 20, the illumination region of the laser beam can be defined by the main portion of the light. The first light emission width can be defined as the width of the laser beam in the fast axis direction of the main portion of the light, and the second light emission width can be defined as the width of the laser beam in the slow axis direction of the main portion of the light.

The illustrated light-emitting device 20 includes the plurality of submounts 25 in a one-to-one relationship with the plurality of light-emitting elements 21. The light-emitting device 20 includes the plurality of reflective members 26 in a one-to-one relationship with the plurality of light-emitting elements 21. The light-emitting device 20 includes one lens member 27 including lens surfaces as many as the plurality of light-emitting elements 21.

In the light-emitting device 20, the plurality of reflective members 26 are arranged side by side in the same direction as the arrangement direction of the plurality of light-emitting elements 21. The plurality of lens surfaces are provided side by side in the same direction as the arrangement direction of the plurality of light-emitting elements 21. The plurality of beams of light are emitted side by side from the light-emitting device 20. The plurality of beams of light are arranged in the same direction as the arrangement direction of the plurality of light-emitting elements 21 and emitted from the light-emitting device 20.

First Optical Unit 30A

The first optical unit 30A includes one or more reflective members 31 (hereinafter, referred to as the first reflective members 31). A plurality of reflective surfaces 31A are provided by the one or more first reflective members 31. The plurality of reflective surfaces 31A are not on the same plane and are parallel to each other. The plurality of reflective surfaces 31A are provided on the same surface side of the first optical unit 30A. The plurality of reflective surfaces 31A are provided at positions that do not overlap in a plan view as seen from the direction perpendicular to a plane parallel to the reflective surfaces 31A but may partially overlap.

The first reflective member 31 has a stepped external shape, with the reflective surfaces 31A formed on each of the consecutive steps. The first reflective member 31 is a tiered structure mirror including a plurality of tiers and the reflective surfaces 31A provided on the tiers.

The plurality of flat surfaces that form the steps in the stepped shape of the first reflective member 31 are referred to as step surfaces. In other words, the first reflective member 31 includes a plurality of step surfaces forming the steps. Defining one of consecutive tiers as a lower tier and the other as an upper tier, the plurality of step surfaces include at least an upper surface of the lower tier, an upper surface of the upper tier, and a lateral surface that intersects both of the upper surfaces.

The upper surface of the step surfaces is referred to as a step upper surface, and the lateral surface is referred to as a step lateral surface. To form steps with a stepped shape, two or more step upper surfaces and one or more step lateral surfaces are required. The step lateral surface intersects both of the step upper surfaces of consecutive tiers. The step upper surfaces and the step lateral surface intersect at a right angle but may not be perpendicular to each other.

The first reflective member 31 includes a bottom surface located on the opposite side to the step upper surfaces. The plurality of step surfaces form the stepped shape using the bottom surface as a base. An outer surface that intersects the top step upper surface on the opposite side to the step lateral surface that intersects the top step upper surface and an outer surface that intersects the bottom step upper surface on the opposite side to the step lateral surface that intersects the bottom step upper surface are provided. The plurality of step surfaces are located between the two outer surfaces.

The plurality of reflective surfaces 31A are provided on the plurality of step upper surfaces. The reflective surfaces 31A are provided on the step upper surfaces of the consecutive tiers. The reflective surfaces 31A have a reflectance of 90% or more, preferably 95% or more, and more preferably 99% or more with respect to light of a specific wavelength. Higher reflectance is preferable for the reflective surfaces 31A, but the reflectance is a parameter that can be set as appropriate as long as the light desired to be used can be sufficiently obtained. The numerical condition of the reflectance described above is a non-limiting condition.

In regard to a step surface, the direction aligned with the direction in which a step is formed is referred to as the step direction. For example, in the illustrated light-emitting module 1, the direction perpendicular to an intersection line of the step upper surface and the step lateral surface in a plane parallel to the step upper surface is the step direction of the step upper surface, and the direction perpendicular to the intersection line of the step upper surface and the step lateral surface in a plane parallel to the step lateral surface is the step direction of the step upper surface.

The length in the step direction of the step upper surface is greater than the length in the step direction of the step lateral surface that intersects the step upper surface. The length in the step direction of the step upper surface is equal to or greater than three times the length in the step direction of the step lateral surface that intersects the step upper surface.

Second Optical Unit 30B

The second optical unit 30B includes a plurality of reflective members 32 (hereinafter, referred to as the second reflective members 32). A plurality of reflective surfaces 33 are provided by the plurality of second reflective members 32. The plurality of reflective surfaces 33 include one or more first reflective surfaces 33A and one or more second reflective surfaces 33B. The first reflective surfaces 33A and the second reflective surfaces 33B have different curved surface shapes.

The plurality of second reflective members 32 include a reflective member 32A including the first reflective surface 33A and a reflective member 32B including the second reflective surface 33B. The plurality of second reflective members 32 may include the second reflective member 32 including two or more reflective surfaces 33. The plurality of second reflective members 32 may include the second reflective member 32 including only one reflective surface 33.

For example, the first reflective surface 33A is formed in a cylindrical concave surface shape, and the second reflective surface 33B is formed in a cylindrical convex surface shape. The plurality of second reflective members 32 include a concave surface cylindrical mirror including the first reflective surface 33A and a convex surface cylindrical mirror including the second reflective surface 33B.

In the illustrated light-emitting module 1, the second optical unit 30B is composed of three second reflective members 32. The second optical unit 30B is composed of two second reflective members 32 including the first reflective surfaces 33A and one second reflective member 32 including the second reflective surface 33B. The former two second reflective members 32 are both concave surface cylindrical mirrors, and the latter single second reflective member 32 is a convex surface cylindrical mirror. The number of second reflective members 32 including the first reflective surfaces 33A is greater than the number of the second reflective members 32 including the second reflective surface 33B.

Condenser Lens 40

The condenser lens 40 is a lens for gathering incident light at a predetermined point or region. The condenser lens 40 is a plano-convex lens, for example.

Optical Fiber 50

The optical fiber 50 includes a fiber that connects a light inlet and a light outlet. Light incident from the light inlet propagates inside the fiber and is emitted from the light outlet. The optical fiber 50 has, for example, a core diameter (hereinafter referred to as a fiber diameter) of 400 μm or less at the light inlet. The fiber diameter may be in a range from 150 μm to 300 μm. Alternatively, the fiber diameter may be in a range from 150 pin to 250 μm. The fiber diameter may be even smaller.

Light-Emitting Module 1

The light-emitting module 1 will now be described.

In the light-emitting module 1, the one or more light-emitting devices 20 are disposed in the arrangement space of the housing 10. The one or more light-emitting devices 20 are disposed on the mounting surface. The light-emitting device 20 is disposed with the lens member 27 facing the first surface side of the housing 10. The plurality of beams of light are emitted upward from the light-emitting device 20.

Four light-emitting elements 21 are arranged in two rows and two columns in the arrangement space of the housing 10. The arrangement is not limited to two rows and two columns and may be three rows and two columns or three rows and three columns, for example. The light-emitting elements 21 may be arranged, on the mounting surface, in N rows and M columns (N≥2 and M≥2, with N and M being natural numbers). In the illustrated light-emitting module 1, eight light-emitting elements 21 are arranged in four rows and two columns.

In the arrangement space of the housing 10, the four beams of light arranged in two rows and two columns are emitted from the one or more light-emitting devices 20 in a predetermined direction (for example, upward). The arrangement is not limited to two rows and two columns and may be three rows and two columns or three rows and three columns, for example. The plurality of beams of light travel in a predetermined direction arranged in N rows and M columns (N≥2 and M≥2, with N and M being natural numbers). The four beams of light do not need to travel in the same direction. For example, the beams of light may travel upward while coming closer together or separating from one another. Preferably, the travel direction of the four beams of light have symmetry. In the illustrated light-emitting module 1, eight beams of light arranged in four rows and two columns travel upward and in the Z direction.

In the illustrated light-emitting module 1, the plurality of light-emitting elements 21 are disposed with the row direction corresponding to the X direction. The plurality of light-emitting elements 21 are disposed with the column direction corresponding to the Y direction.

When defining the distance between two adjacent beams of light, the distance between the centers and the distance between the outer edges can be considered. The distance between the centers of two adjacent beams of light can be obtained using the midpoint of the first light emission width as the light center. The distance between the centers of two adjacent beams of light can also be obtained using the midpoint of the second light emission width as the light center. The distance between the outer edges can be obtained on the basis of the outer edges of illumination regions of the light beams. When two adjacent light illumination regions overlap, the outer edge-to-outer edge distance is zero.

The center-to-center distance based on the first light emission width is referred to as a first center-to-center distance, the center-to-center distance based on the second light emission width is referred to as a second center-to-center distance, the outer edge-to-outer edge distance based on the first light emission width is referred to as a first outer edge-to-outer edge distance, and the outer edge-to-outer edge distance based on the second light emission width is referred to as a second outer edge-to-outer edge distance to distinguish between them.

In the illustrated light-emitting module 1, the center-to-center distance in the row direction corresponds to the first center-to-center distance, the center-to-center distance in the column direction corresponds to the second center-to-center distance, the outer edge-to-outer edge distance in the row direction corresponds to the first outer edge-to-outer edge distance, and the outer edge-to-outer edge distance in the column direction corresponds to the second outer edge-to-outer edge distance. In FIG. 13, the first light emission width, the second light emission width, the first center-to-center distance, the second center-to-center distance, the first outer edge-to-outer edge distance, and the second outer edge-to-outer edge distance are denoted by the reference signs W1, W2, C1, C2, E1, and E2, respectively.

The plurality of beams of light emitted from the one or more light-emitting devices 20 have a difference between the first center-to-center distance and the second center-to-center distance at the emission point from the one or more light-emitting devices 20. At this emission point, the first center-to-center distance is longer than the second center-to-center distance. Note that these distances may be the same.

At this emission point, the first center-to-center distance is greater than the first light emission width of any of the two adjacent beams of light. At this emission point, the second center-to-center distance is greater than the second light emission width of any of the two adjacent beams of light. That is, it can be said that there is a gap between the two adjacent beams of light. In other words, it can be said that both the first outer edge-to-outer edge distance and the second outer edge-to-outer edge distance have a value greater than 0.

In the illustrated light-emitting module 1, the plurality of light-emitting devices 20 are disposed. The plurality of light-emitting devices 20 include the first light-emitting device 20A and the second light-emitting device 20B arranged side by side. The first light-emitting device 20A and the second light-emitting device 20B are arranged side by side in the row direction. The plurality of light-emitting elements 21 of the light-emitting device 20 are arranged side by side in the column direction. The arrangement direction of the first light-emitting device and the second light-emitting device corresponds to the X direction. The arrangement direction of the plurality of light-emitting elements 21 of the light-emitting device 20 corresponds to the Y direction.

In the illustrated light-emitting module 1, the plurality of light-emitting elements 21 (hereinafter referred to as first light-emitting elements) of the first light-emitting device 20A and the plurality of light-emitting elements 21 (hereinafter referred to as second light-emitting elements) of the second light-emitting device 20B are disposed at an equal interval (the first outer edge-to-outer edge distance) in each row. The interval (the second outer edge-to-outer edge distance) at which the plurality of first light-emitting elements are arranged and the interval (the second outer edge-to-outer edge distance) at which the plurality of second light-emitting elements are arranged are the same. Note that these intervals do not need to be the same.

For example, as illustrated in FIG. 12, by manufacturing the light-emitting unit 2 mounted with the first light-emitting device 20A and the second light-emitting device 20B on one wiring substrate, mounting in the light-emitting module 1 can be easily performed. The illustrated light-emitting unit 2 further includes a wiring line connector 2A, with the two light-emitting devices 20 both being able to be supplied with power from the wiring line connector 2A. In the illustrated light-emitting module 1, the flexible wiring line 2B is connected to the wiring line connector 2A.

In the illustrated light-emitting module 1, the beams of light emitted from the plurality of light-emitting elements 21 are made parallel in terms of their optical axes and emitted upward from the one or more light-emitting devices 20. The term "parallel" used here has a tolerance of ±2 degrees. The travel direction of a plurality of collimated beams of light emitted from the one or more light-emitting devices 20 corresponds to the Z direction.

In the light-emitting module 1, the first optical unit 30A is disposed in the arrangement space of the housing 10. The first optical unit 30A is disposed above the one or more light-emitting devices 20. The light emitted from the light-emitting device 20 is emitted to the first optical unit 30A. The light emitted from the light-emitting device 20 is reflected by the reflective surfaces 31A of the first optical unit 30A.

In the light-emitting module 1, the plurality of beams of light emitted from the one or more light-emitting devices 20 are emitted to the plurality of reflective surfaces 31A and reflected by the plurality of reflective surfaces 31A. The plurality of reflective surfaces 31A have the reflectance characteristics of the first optical unit 30A described above with respect to the beams of light emitted from the one or more light-emitting devices 20.

In a top view, the centers of the second light emission widths of the plurality of beams of light arranged in the column direction overlap the different reflective surfaces 31A. In a top view, the second light emission widths of the plurality of beams of light arranged in the column direction overlap the different reflective surfaces 31A. The plurality of beams of light arranged in the column direction are emitted to the different reflective surfaces 31A.

In a top view, the centers of the first light emission widths of the plurality of beams of light arranged in the row direction overlap the same reflective surface 31A. In a top view, the first light emission widths of the plurality of beams of light arranged in the row direction overlap the same reflective surface 31A. In the illustrated light-emitting module 1, for each of the plurality of beams of light, a main portion of light is emitted to one reflective surface 31A from among the plurality of reflective surfaces 31A and is not emitted to the other reflective surfaces 31A.

The reflective surfaces 31A are disposed at an angle with respect to the mounting surface. The plurality of reflective surfaces 31A are arranged in the column direction in a top view. The plurality of reflective surfaces 31A arranged in the column direction are disposed above each other from the reflective surface 31A at one end to the reflective surface 31A at the other end.

The plurality of beams of light emitted from the single light-emitting device 20 are emitted to the single first reflective member 31. The first reflective member 31 includes the reflective surfaces 31A whose number is equal to or greater than the number of beams of light emitted from the light-emitting device 20. With one first reflective member 31 being associated with one light-emitting device 20, mounting is made easy.

In the illustrated light-emitting module 1, the first optical unit 30A is composed of one first reflective member 31. One first reflective member 31 is associated with two light-emitting devices 20. One first reflective member 31 may be associated with one light-emitting device 20.

The first optical unit 30A emits the plurality of beams of light reflected by the plurality of reflective surfaces 31A. The light emitted from the first optical unit 30A travels in the column direction. The plurality of beams of light arranged in the vertical direction are emitted from the first optical unit 30A. The plurality of beams of light arranged in the vertical direction are a plurality of beams of light arranged in the direction of the second light emission width.

In the illustrated light-emitting module 1, the plurality of beams of light arranged in the second light emission width are emitted arranged in the Z direction from the first optical unit 30A. The plurality of beams of light emitted from the first optical unit 30A travel in the Y direction. All of the plurality of beams of light emitted from the first optical unit 30A are still collimated light.

The second outer edge-to-outer edge distance of the plurality of beams of light arranged in the direction of the second light emission width emitted from the first optical unit 30A is less than the second outer edge-to-outer edge distance of the plurality of beams of light arranged in the direction of the second light emission width at the emission point for emission from the one or more light-emitting devices 20. That is, the plurality of beams of light emitted from the one or more light-emitting devices 20 with an interval of a predetermined distance in the direction of the second light emission width are emitted from the first optical unit 30A with a smaller interval. Accordingly, the overall illumination region of the plurality of beams of light arranged in the direction of the second light emission width can be made narrower.

The first outer edge-to-outer edge distance of the plurality of beams of light arranged in the direction of the first light emission width emitted from the first optical unit 30A is equal to the first outer edge-to-outer edge distance of the plurality of beams of light arranged in the direction of the first light emission width at the emission point for emission from the one or more light-emitting devices 20. Accordingly, with the first optical unit 30A, the overall illumination region of the plurality of beams of light can be made narrower.

In the illustrated light-emitting module 1, the plurality of beams of light emitted from the first light-emitting device 20A with a predetermined interval in the slow axis direction are emitted from the first optical unit 30A with a smaller interval, and the plurality of beams of light emitted from the second light-emitting device 20B with a predetermined interval in the slow axis direction are emitted from the first optical unit 30A with a smaller interval.

In the illustrated light-emitting module 1, the first optical unit 30A includes the one or more first reflective members 31 provided with the plurality of reflective surfaces 31A on which are incident a plurality of laser beams emitted from the first light-emitting device 20A (hereinafter, referred to as first lasers) and a plurality of laser beams emitted from the second light-emitting device 20B (hereinafter, referred to as second laser beams). Also, the first optical unit 30A makes the interval of the plurality of first laser beams arranged in the slow axis direction smaller than the distance when they are emitted from the first light-emitting device 20A and makes the interval of the plurality of second laser beams arranged in the slow axis direction smaller than the distance when they are emitted from the second light-emitting device 20B, and then the plurality of first laser beams and the plurality of second laser beams are emitted from the first optical unit 30A.

The second outer edge-to-outer edge distance of the plurality of beams of light arranged in the direction of the second light emission width emitted from the first optical unit 30A is equal to or greater than 0 μm and less than 500 μm. This second outer edge-to-outer edge distance is 300 μm or more smaller than the second outer edge-to-outer edge distance at the emission point for emission from the one or more light-emitting devices 20. The second light emission width of the light emitted from the light-emitting device 20 is preferably in a range from 250 μm to 500 μm. By narrowing the second outer edge-to-outer edge distance in this manner, the narrowing of the overall illumination region of the plurality of beams of light is more effective.

In the light-emitting module 1, the second optical unit 30B is disposed in the arrangement space of the housing 10. The second optical unit 30B is disposed above and lateral to the one or more light-emitting devices 20. The light emitted from the light-emitting device 20 is emitted to the second optical unit 30B. The light emitted from the first optical unit 30A is emitted to the second optical unit 30B. The light reflected by the reflective surfaces 33 is emitted from the second optical unit 30B.

The light incident on the second optical unit 30B is reflected two or more times and then emitted from the second optical unit 30B. The light incident on the second optical unit 30B is emitted to the first reflective surfaces 33A, reflected by the first reflective surfaces 33A, and then emitted to the second reflective surface 33B. The first reflective surfaces 33A convert the light incident on the first reflective surfaces 33A into convergent light and reflect the convergent light. The reflected convergent light travels toward the second reflective surface 33B. The second reflective surface 33B converts the light incident on the second reflective surface 33B into collimated light and reflects the collimated light. The light collimated by the second reflective surface 33B is emitted from the second optical unit 30B.

The first outer edge-to-outer edge distance of the plurality of beams of light arranged in the direction of the first light emission width emitted from the second optical unit 30B is less than the first outer edge-to-outer edge distance of the plurality of beams of light arranged in the direction of the first light emission width at the emission point for emission from the one or more light-emitting devices 20. That is, the plurality of beams of light emitted from the one or more light-emitting devices 20 with an interval of a predetermined distance in the direction of the first light emission width are emitted from the second optical unit 30B with a smaller interval. Accordingly, the overall illumination region of the plurality of beams of light arranged in the direction of the first light emission width can be made narrower.

The first outer edge-to-outer edge distance of the plurality of beams of light arranged in the direction of the first light emission width emitted from the second optical unit 30B is less than the first outer edge-to-outer edge distance of the plurality of beams of light arranged in the direction of the first light emission width until being incident on the second optical unit 30B after being emitted from the first optical unit 30A.

The first light emission width of the plurality of beams of light emitted from the second optical unit 30B is less than the first light emission width at the emission point for emission from the one or more light-emitting devices 20. That is, the plurality of beams of light emitted from the one or more light-emitting devices 20 are emitted from the second optical unit 30B with a smaller first light emission width. Accordingly, the overall illumination region of the plurality of beams of light arranged in the direction of the first light emission width can be made narrower.

The second outer edge-to-outer edge distance of the plurality of beams of light arranged in the direction of the second light emission width emitted from the second optical unit 30B is the same as the second outer edge-to-outer edge distance of the plurality of beams of light arranged in the direction of the second light emission width emitted from the first optical unit 30A. Accordingly, with the second optical unit 30B, the overall illumination region of the plurality of beams of light can be made narrower.

In the illustrated light-emitting module 1, the plurality of beams of light incident on the first optical unit 30A and then emitted from the first optical unit 30A are incident on the second optical unit 30B. That is, the plurality of beams of light are first incident on the first optical unit 30A before being incident on the second optical unit 30B. The light-emitting module may also be designed such that the plurality of beams of light first enter the second optical unit 30B before being incident on the first optical unit 30A.

In the illustrated light-emitting module 1, the plurality of beams of light emitted from the first light-emitting device 20A and the second light-emitting device 20B with a predetermined interval in the fast axis direction are emitted from the second optical unit 30B with a smaller interval and a smaller width in the fast axis direction.

In the illustrated light-emitting module 1, the second optical unit 30B includes the plurality of second reflective members 32 provided with the plurality of reflective surfaces 33 on which are incident the plurality of first laser beams and the plurality of second laser beams. The second optical unit 30B reflects, two times or more, the first laser beams and the second laser beams emitted from the second light-emitting device with a predetermined distance in the fast axis direction away from the first laser beams and then emits them from the second optical unit 30B with a smaller interval than the predetermined distance and with a smaller width in the fast axis direction of the laser beams.

In the illustrated light-emitting module 1, the second reflective member 32 including the first reflective surface 33A that reflects the plurality of beams of light emitted from the first light-emitting device 20A and the second reflective member 32 including the first reflective surface 33A that reflects the plurality of beams of light emitted from the second light-emitting device 20B are arranged side by side. By using the two second reflective members 32, positional adjustment of the first reflective surface 33A with respect to the plurality of beams of light emitted from the first light-emitting device 20A and positional adjustment of the first reflective surface 33A with respect of the plurality of beams of light emitted from the second light-emitting device 20B can be individually performed, allowing accuracy to be improved.

In the illustrated light-emitting module 1, at one of the two second reflective members 32 including the first reflective surface 33A, the plurality of beams of light emitted from the first light-emitting device 20A are reflected, and the plurality of beams of light emitted from the second light-emitting device 20B are not reflected. At the other of the second reflective members 32, the plurality of beams of light emitted from the second light-emitting device 20B are reflected, and the plurality of beams of light emitted from the first light-emitting device 20A are not reflected.

In the illustrated light-emitting module 1, at the second reflective member 32 including the second reflective surface 33B, the plurality of beams of light emitted from the first light-emitting device 20A are reflected, and the plurality of beams of light emitted from the second light-emitting device 20B are reflected. Since the plurality of convergent beams of light are incident on the second reflective member 32, the beams of light are easily collectively reflected by the one reflective surface 33. Although an interval is required when disposing the second reflective members 32 separately, with one second reflective member 32, an interval between the light emitted from the first light-emitting device 20A and the light emitted from the second light-emitting device 20B can be made smaller than that required when disposing the second reflective members 32 separately.

In the light-emitting module 1, the condenser lens 40 is disposed in the arrangement space of the housing 10. A plurality of beams of light emitted from second optical unit 30B after being incident on the second optical unit 30B, which are also beams of light emitted from the first optical unit 30A after being incident on the first optical unit 30A, are incident on the condenser lens 40. The condenser lens 40 gathers the plurality of beams of light that have traveled through the first optical unit 30A and the second optical unit 30B.

In the light-emitting module 1, the optical fiber 50 is connected to the light emission portion 12 of the housing 10. The optical fiber 50 is attached to the light outlet of the housing 10, for example. The plurality of beams of light that have traveled through the condenser lens 40 are incident on the optical fiber 50. The plurality of beams of light gathered by the condenser lens 40 are incident on the light inlet of the optical fiber 50. Light incident from the light inlet of the optical fiber 50 propagates inside the fiber and is emitted from the light outlet.

In the light-emitting module 1, the plurality of beams of light gathered by the condenser lens 40 are made incident on the optical fiber 50. When taking into account intersection in actual manufacture, by making the overall illumination region of the plurality of beams of light incident on the condenser lens 40 smaller, the illumination region at the light inlet of the optical fiber 50 can be made smaller. By making the overall illumination region of the plurality of beams of light by the first optical unit 30A and the second optical unit 30B smaller, the fiber diameter at the light inlet of the optical fiber 50 can be made smaller.

Figure 14:
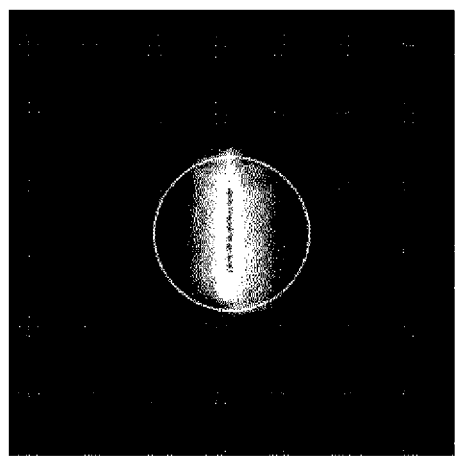
FIG. 14 is a diagram illustrating an example of a simulation result for the light-emitting module according to the embodiment.
Figure 15:
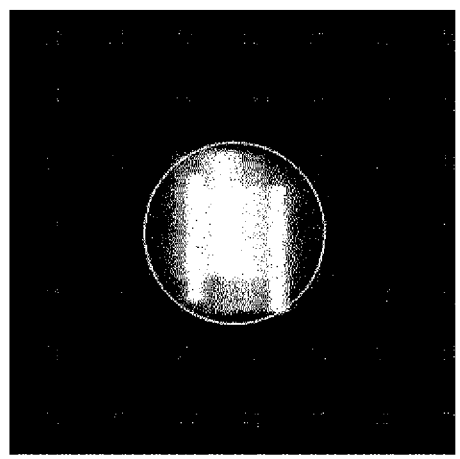
FIG. 15 is a diagram illustrating another example of a simulation result for the light-emitting module according to the embodiment.

FIG. 14 is a diagram illustrating an example of a simulation result of a plurality of beams of light emitted to the light inlet of the optical fiber 50 in the illustrated light-emitting module 1. The circle in the diagram can be presumed to be the fiber diameter at the light inlet of the optical fiber 50. In this diagram, the obtained result is of the eight beams of light being gathered and made incident on the optical fiber with a fiber diameter of 207 μm. FIG. 15 illustrates the result of a simulation in which the light-emitting module 1 used is spread out more in terms of mounting than that of the light-emitting module 1 of FIG. 14. In this diagram, the obtained result is of the eight beams of light being gathered and made incident on the optical fiber with a fiber diameter of 242 μm. In this case of an ideal light-emitting module 1, a result in which the beams of light can be incident on the optical fiber with a fiber diameter of 169 μm is obtained. On the basis of these simulation results, in the light-emitting module 1 according to the embodiments, 6 or more and 12 or less beams of light emitted from the one or more light-emitting devices 20 can be incident on the optical fiber with a fiber diameter in a range from 150 μm to 300 μm. The 6 or more and 10 or less beams of light emitted from the one or more light-emitting devices 20 can be incident on the optical fiber with a fiber diameter in a range from 150 μm to 250 μm. By using the technique disclosed for the light-emitting module 1, though not limited to this condition, it is possible to make more light incident on the optical fiber with a smaller fiber diameter.

Although the embodiments according to the present invention have been described above, the light-emitting device according to the present invention is not strictly limited to the light-emitting devices of the embodiments. In other words, the present invention can be achieved without being limited to the external shape or structure of the light-emitting device disclosed by the embodiments. The present invention may be applied without requiring all the components being sufficiently provided. For example, in a case in which some of the components of the light-emitting device disclosed by the embodiments are not stated in the claims, the degree of freedom in design by those skilled in the art such as substitutions, omissions, shape modifications, and material changes for those components is allowed, and then the invention stated in the claims being applied to those components is specified.

The light-emitting device described in the embodiments can be used for lighting, a projector, an on-vehicle headlight, a head-mounted display, a display, and the like.

Reference Signs List
- 1 Light-emitting module
  - 10 Housing
    - 12 Light emission portion
  - 20 Light-emitting device
    - 20A First light-emitting device
    - 20B Second light-emitting device
    - 21 Light-emitting element
    - 22 Package
      - 23 Base member
      - 24 Lid member
    - 25 Submount
    - 26 Reflective member
    - 27 Lens member
  - 30 Optical unit
    - 30A First optical unit
      - 31 First reflective member
        - 31A Reflective surface
    - 30B Second optical unit
    - 32 Second reflective member
      - 32A Reflective member
      - 32B Reflective member
      - 33 Reflective surface
        - 33A First reflective surface
        - 33B Second reflective surface
  - 40 Condenser lens
  - 50 Optical fiber
- 2 Light-emitting unit
  - 2A Wiring line connector
  - 2B Flexible wiring line

The invention claimed is:

1. A light-emitting module comprising:
a first light-emitting device that includes a plurality of first semiconductor laser elements each of which emits a first laser beam, the plurality of first laser beams being emitted with an interval of a first distance in a slow axis direction of the first laser beams;
a second light-emitting device that is arranged side by side with the first light-emitting device in a fast axis direction and includes a plurality of second semiconductor laser elements each of which emits a second laser beam, the plurality of second lasers being emitted with an interval of a second distance in a slow axis direction of the second laser beams and with a third distance away from the first laser beams in a fast axis direction;
a first optical unit that includes one or more first reflective members provided with a plurality of reflective surfaces on which the plurality of first laser beams and the plurality of second laser beams are incident and that makes the interval of the plurality of first laser beams arranged in the slow axis direction smaller than the first distance, makes the interval of the plurality of second laser beams arranged in the slow axis direction smaller than the second distance, and emits the plurality of first laser beams and the plurality of second laser beams;
a second optical unit that includes a plurality of second reflective members provided with a plurality of reflective surfaces on which the plurality of first laser beams and the plurality of second laser beams are incident that reflects, two times or more, the first laser beams and the second laser beams, and that emits the laser beams with an interval smaller than the third distance and with a smaller width in the fast axis direction of each of the laser beams; and
a condenser lens that gathers the plurality of first laser beams and the plurality of second laser beams having traveled through the first optical unit and the second optical unit.

2. The light-emitting module according to claim 1, further comprising:
an optical fiber on which the plurality of first laser beams and the plurality of second laser beams gathered by the condenser lens are incident.

3. The light-emitting module according to claim 2, wherein
the plurality of first laser beams and the plurality of second laser beams are in total six or more laser beams, and
a fiber diameter of the optical fiber on which the plurality of first laser beams and the plurality of second laser beams are incident is in a range from 150 μm to 300 μm.

4. The light-emitting module according to claim 1, wherein
the first optical unit is a tiered structure mirror including a plurality of tiers and the reflective surfaces provided on the tiers, and
the plurality of second reflective members include a first concave surface cylindrical mirror and a convex surface cylindrical mirror.

5. The light-emitting module according to claim 4, wherein
the plurality of second reflective members further include a second concave surface cylindrical mirror,
at the first concave surface cylindrical mirror, the plurality of first laser beams are reflected and the plurality of second laser beams are not reflected,
at the second concave surface cylindrical mirror, the plurality of second laser beams are reflected and the plurality of first laser beams are not reflected, and
at the convex surface cylindrical mirror, the plurality of first laser beams and the plurality of second laser beams are reflected.

6. The light-emitting module according to claim 1, wherein
the first distance and the second distance are identical.

7. The light-emitting module according to claim 1, wherein
the plurality of first laser beams and the plurality of second laser beams emitted from the first optical unit are incident on the second optical unit.

8. The light-emitting module according to claim 1, wherein
the first light-emitting device emits the plurality of first laser beams as collimated light, and
the second light-emitting device emits the plurality of second laser beams as collimated light.

* * * * *